(12) United States Patent
Park et al.

(10) Patent No.: US 10,293,326 B2
(45) Date of Patent: May 21, 2019

(54) POLYSILICON MANUFACTURING APPARATUS

(71) Applicant: HANWHA CHEMICAL CORPORATION, Seoul (KR)

(72) Inventors: Sung Eun Park, Yeosu-si (KR); Jiwoong Kim, Seoul (KR); Hee Dong Lee, Seoul (KR)

(73) Assignee: HANWHA CHEMICAL CORPORATION, Seoul (KR)

( * ) Notice: Subject to any disclaimer, the term of this patent is extended or adjusted under 35 U.S.C. 154(b) by 0 days.

(21) Appl. No.: 15/750,251

(22) PCT Filed: Sep. 8, 2016

(86) PCT No.: PCT/KR2016/010106
§ 371 (c)(1),
(2) Date: Feb. 5, 2018

(87) PCT Pub. No.: WO2017/043892
PCT Pub. Date: Mar. 16, 2017

(65) Prior Publication Data
US 2018/0229203 A1    Aug. 16, 2018

(30) Foreign Application Priority Data

Sep. 8, 2015    (KR) .................. 10-2015-0126701
Aug. 11, 2016   (KR) .................. 10-2016-0102394

(51) Int. Cl.
*B01J 19/00*    (2006.01)
*C23C 16/24*    (2006.01)
(Continued)

(52) U.S. Cl.
CPC ....... *B01J 19/0053* (2013.01); *B01J 19/0013* (2013.01); *B01J 19/08* (2013.01);
(Continued)

(58) Field of Classification Search
CPC .... B01J 19/0013; B01J 19/0053; B01J 19/08; B01J 19/087; B01J 19/24; C01B 33/035; C23C 16/24; C23C 16/4418; C23C 16/46
See application file for complete search history.

(56) References Cited

U.S. PATENT DOCUMENTS 8,858,894 B2 * 10/2014 Stocklinger .............. B01J 15/00
                                                       422/129
2011/0126761 A1    6/2011 Lee
(Continued)

FOREIGN PATENT DOCUMENTS

CN         203319708        12/2013
KR    10-2010-0117492       11/2010
(Continued)

OTHER PUBLICATIONS

Z. Huang at al., "Development of a Polysilicon Chemical Vapor Deposition Reactor Using the Computational Fluid Dynamics Method", ECS Journal of Solid State Science and Technology, vol. 2, No. 11, p. 457-p. 464, 2013.
(Continued)

*Primary Examiner* — Lessanework Seifu
(74) *Attorney, Agent, or Firm* — Lex IP Meister, PLLC

(57) ABSTRACT

Provided is a polysilicon manufacturing apparatus including a reactor disposed on a base plate to form a reaction chamber, a pair of electrical feedthroughs installed on the base plate to be extended to the inside of the reaction chamber, rod filaments installed on the electrical feedthroughs in the reaction chamber and connected to each other by a rod bridge at the upper end to form a silicon rod by chemical vapor deposition of source gas introduced to a gas inlet, and a cooling jacket inserted to a through-hole provided at the upper side of the reactor to be supported to the base plate, connected to a gas outlet formed on the base plate by forming a gas passage discharging the gas after
(Continued)

reaction, and introducing and circulating a low-temperature coolant to a coolant passage from the outside of the reactor by forming the coolant passage at the outside of the gas passage to discharge a high-temperature coolant to the outside of the reactor.

11 Claims, 17 Drawing Sheets

(51) Int. Cl.
  *C23C 16/44* (2006.01)
  *B01J 19/08* (2006.01)
  *C01B 33/035* (2006.01)
  *C23C 16/46* (2006.01)
(52) U.S. Cl.
  CPC ............ *C01B 33/035* (2013.01); *C23C 16/24* (2013.01); *C23C 16/4418* (2013.01); *C23C 16/46* (2013.01)

(56) References Cited

U.S. PATENT DOCUMENTS

| | | | |
|---|---|---|---|
| 2011/0305604 | A1 | 12/2011 | Stocklinger |
| 2012/0207662 | A1* | 8/2012 | Netsu .................... C01B 33/035 423/349 |
| 2014/0165909 | A1* | 6/2014 | Anderson ............. C01B 33/035 118/715 |

FOREIGN PATENT DOCUMENTS

| | | |
|---|---|---|
| KR | 10-1178046 | 8/2012 |
| KR | 10-2013-0019183 | 2/2013 |
| KR | 10-2013-0019568 | 2/2013 |
| KR | 10-2014-0136985 | 12/2014 |
| TW | 201525207 | 7/2015 |

OTHER PUBLICATIONS

WIPO, PCT Search Report & Written Opinion of PCT/KR2016/010106 dated Jan. 9, 207.

* cited by examiner

POLYSILICON MANUFACTURING APPARATUS

TECHNICAL FIELD

The present invention relates to a polysilicon manufacturing apparatus.

More particularly, the present invention relates to a polysilicon manufacturing apparatus in which a flow of source gas is formed as a laminar flow in a chemical vapor deposition reactor.

BACKGROUND ART

Polycrystal-state silicon, that is, polysilicon or polycrystalline silicon is a component used as a basic material in solar energy generation industry and semiconductor industry, and recently, the demand thereof has been rapidly increased with the development of the corresponding industries.

In the manufacturing method of polysilicon, a silicon precipitation process (alternatively, a chemical vapor deposition process) of forming polysilicon in a solid state from silane source gas is representative.

The silicon precipitation process generates silicon particles through a hydrogen reduction reaction and pyrolysis of the silane source gas at a high temperature and the silicon particles are formed in a polycrystalline state on the surface of rods or particles to be precipitated.

As an example, a simens precipitation method using a chemical vapor deposition reactor, a precipitation method using a fluidized bed reactor, and the like are included.

The simens chemical vapor deposition reactor is a batch process apparatus as a polysilicon manufacturing process.

In the chemical vapor deposition method, a silicon filament (Si filament) having a diameter of 7 to 10 mm and a length of 2,500 to 3,000 mm in the reactor is installed, resistor heating is generated by applying power to the Si filament, and source gas is injected for 60 to 80 hours under a high-pressure condition to produce silicon rod (Si rod) having a diameter of 120 to 150 mm.

For example, during the chemical vapor deposition process, the source gas is introduced from the lower portion of the reactor and then is discharged to the lower portion again by shifting a direction at the upper portion to form a turbulent flow.

The turbulent flow increases heat loss by convection to increase an electric basic unit.

By the turbulent flow, when the source gas is left between the introducing flow and the discharging flow, hot spots are formed to increase a deviation in gas velocity around the silicon rod, a deviation in diameter of the Si rod, and a deviation in surface temperature of the Si rod.

When the surface temperatures of the Si rods are nonuniform, a popcorn is generated around the hot spot to deteriorate productivity and quality of the polysilicon. That is, competitiveness of the polysilicon is lowered.

DISCLOSURE

Technical Problem

The present invention has been made in an effort to provide a polysilicon manufacturing apparatus having advantages of forming a flow of source gas as a laminar flow in a chemical vapor deposition reactor.

That is, the present invention has been made in an effort to provide a polysilicon manufacturing apparatus having advantages of maximizing energy reduction by suppressing a convective heat loss through a laminar flow at a slow rate and minimizing a deviation in gas velocity around a Si rod, a deviation in diameter of the Si rod, and a deviation in surface temperature of the Si rod.

Technical Solution

An exemplary embodiment of the present invention provides a polysilicon manufacturing apparatus including: a reactor disposed on a base plate to form a reaction chamber; a pair of electrical feedthroughs installed on the base plate to be extended to the inside of the reaction chamber; rod filaments installed on the electrical feedthroughs in the reaction chamber and connected to each other by a rod bridge at the upper end to form a silicon rod by chemical vapor deposition of source gas introduced to a gas inlet; and a cooling jacket inserted to a through-hole provided at the upper side of the reactor to be supported to the base plate, connected to a gas outlet formed on the base plate by forming a gas passage discharging the gas after reaction, and introducing and circulating a low-temperature coolant to a coolant passage from the outside of the reactor by forming the coolant passage at the outside of the gas passage to discharge a high-temperature coolant to the outside of the reactor.

The gas outlet may be formed at the center of the base plate, and the gas inlet may be disposed at a location spaced apart from the gas outlet to the outside in a diameter direction of the base plate.

The cooling jacket may be disposed at the center of the reaction chamber to connect the gas passage to the gas outlet.

The polysilicon manufacturing apparatus may further include a gasket disposed between the cooling jacket and the base plate, in which the gasket may communicate between the gas passage and the gas outlet and block the communication from the inside of the reaction chamber.

A lower end of the cooling jacket may form a concave groove, and the gasket may be coupled to the concave groove at one side and supported to the base plate at the other side.

The cooling jacket may include a coolant passage installed in the reactor and connected to the coolant passage to introduce a low-temperature coolant, a coolant outlet connected to the coolant passage to discharge a high-temperature coolant, and an inner pipe and an outer pipe connecting the coolant inlet and the coolant outlet to the coolant passage and spaced apart from each other to form the gas passage at the inside and form the coolant passage at the outside.

The reactor may provide a first flange at the outside of the penetrated installation hole, the cooling jacket may include a second flange fixed to the coolant inlet and the coolant outlet, and while the cooling jacket is inserted into the reactor, the second flange may close the installation hole on the first flange and be fastened to the first flange by a fastening member.

The inner pipe and the outer pipe may form an opening of the gas passage corresponding to the upper end of the rod filament.

The cooling jacket may be formed by one of incoloy (Incoloy 800H, Incoloy 800), stainless steel (SS316L, SS316) and hastelloy.

The source gas may include trichlorosilane (TCS).

The source gas may further include at least one of dichlorosilane (DCS), silicon tetrachloride (STC) and hydrogen.

Advantageous Effects

According to the exemplary embodiment of the present invention, a cooling jacket including a gas passage and a coolant passage is installed in the reactor to discharge gas after a chemical vapor deposition reaction from the upper portion to the gas passage and form a flow of source gas in the reactor as a laminar flow set from the lower portion to the upper portion.

Therefore, the laminar flow of the source gas can minimize a deviation in gas velocity around a Si rod formed by depositing silicon to a rod filament, a deviation in diameter of the Si rod, and a deviation in surface temperature of the Si rod.

Further, the laminar flow can reduce a heat loss by convection and decrease an electric basic unit.

<Description of symbols>

Figure 1:
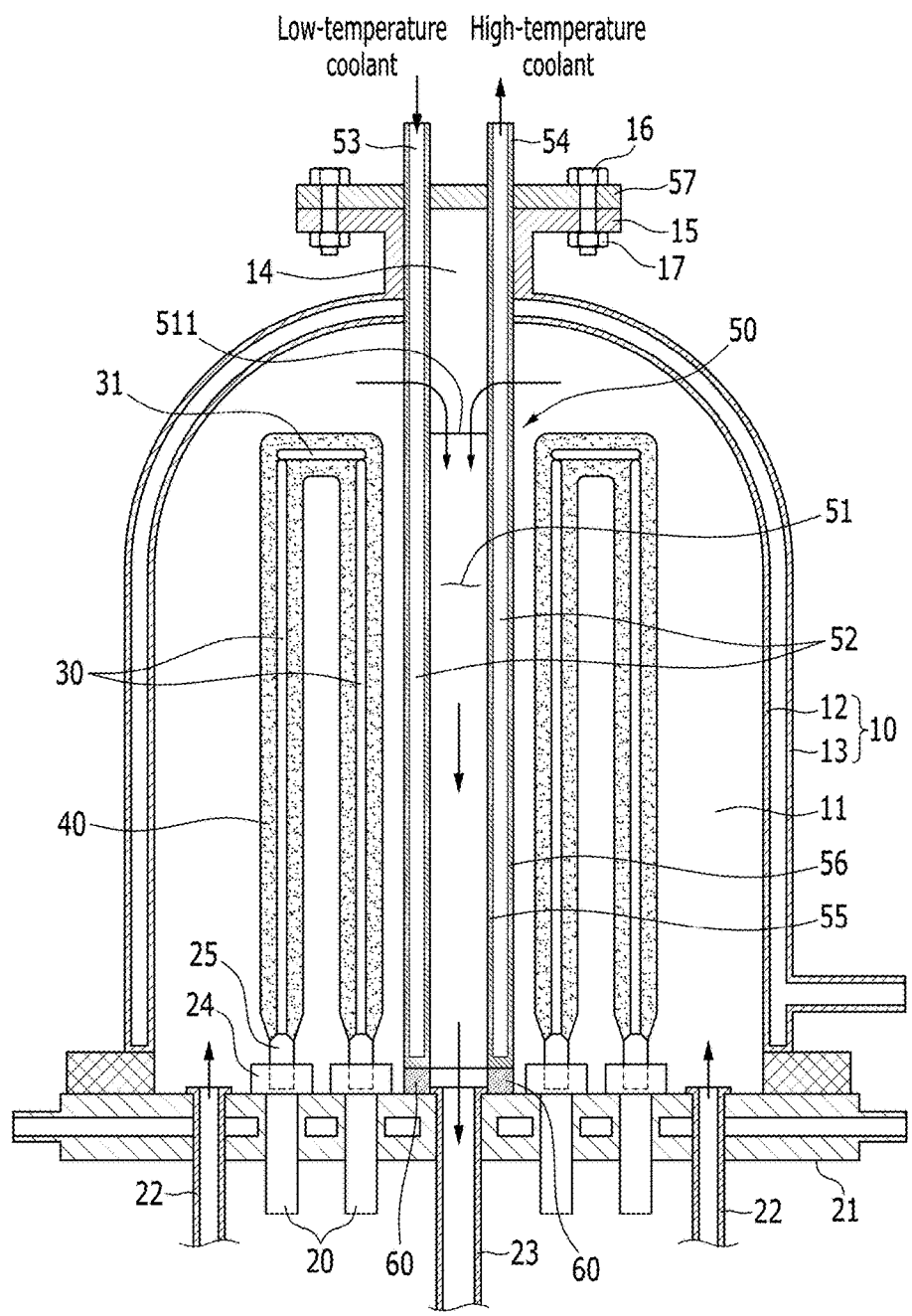
FIG. 1 is a cross-sectional view of a polysilicon manufacturing apparatus according to an exemplary embodiment of the present invention.

| | |
|---|---|
| 10: Reactor | 11: Reaction chamber |
| 12: Bell jar | 13: Chamber cover |
| 14: Installation hole | 15, 57: First, second flanges |
| 16: Bolt | 17: Nut |
| 20: Electrical feedthroughs | 21: Base plate |
| 22: Gas inlet | 23: Gas outlet |
| 24: Rod supporter | 25: Electrode |
| 30: Rod filament | 31: Rod bridge |
| 40: Silicon rod | 50: Cooling jacket |

-continued

<Description of symbols>

| | |
|---|---|
| 51: Gas passage | 52: Coolant passage |
| 53: Coolant inlet | 54: Coolant outlet |
| 55: Inner pipe | 56: Outer pipe |
| 60: Gasket | 80, 90, 101: Reactor |
| 151, 571: Fastener | 501: Concave groove |
| LF: Laminar flow | HS1, HS2: Hot spot |

MODE FOR INVENTION

The present invention will be described more fully hereinafter with reference to the accompanying drawings, in which example embodiments of the invention are shown. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification.

FIG. 1 is a cross-sectional view of a polysilicon manufacturing apparatus according to an exemplary embodiment of the present invention. Referring to FIG. 1, a polysilicon manufacturing apparatus according to an exemplary embodiment includes a cooling jacket 50 in a reactor 10 (a simens type chemical vapor deposition reactor) to supply source gas and discharge the gas to a gas passage 51 of the cooling jacket 50 after the chemical vapor deposition reaction.

In this case, the cooling jacket 50 cools the gas after reaction to a coolant passage 52 provided at the outside of the gas passage 51 while discharging the gas after reaction to the gas passage 51 therein. The cooling of the gas after reaction does not thermally influence the source gas introduced to the reactor 10 while the gas after reaction at a high temperature is discharged to the gas passage 51.

Further, the cooling jacket 50 is installed at the center of a reaction chamber 11 set as the reactor 10 to discharge the gas after reaction in which the reaction is completed through the gas passage 51 from the upper portion of the inside of the reactor 10 corresponding to a reaction completed point. In addition, since the source gas is introduced from the lower portion of the reactor 10 and the gas after reaction is immediately discharged from the upper portion of the reactor 10, a laminar flow of the source gas may be efficiently formed in the reactor 10.

The source gas in the reactor 10 flows from the lower portion to the upper portion and the gas after reaction is discharged from the upper center to the lower portion to form the laminar flow in the reaction chamber 11, and as a result, a deviation in gas velocity around a silicon rod 40, a deviation in diameter in the silicon rod 40, and a deviation in surface temperature of the silicon rod 40 are decreased.

Accordingly, a heat loss by convection is reduced and thus electricity consumption may be decreased. In addition, hot spots may be minimized around the silicon rod 40 in the reactor 10. That is, a popcorn may be suppressed from being generated in the silicon rod 40 and silicon powder may be easily discharged from the reaction chamber 11.

Further, the source gas includes trichlorosilane (TCS) ($SiHCl_3+H_2 \rightarrow Si+SiHCl_3+SiCl_4+HCl+H_2$) and is sufficient to about 10 to 20% of a monosilane flow rate in the related art. That is, the silicon rod 40 may be prepared by a small flow rate of source gas.

The source gas may further include one or more of dichlorosilane (DCS), silicon tetrachloride (STC) and hydrogen.

The trichlorosilane (TCS) has weak corrosion resistance due to a decomposition temperature of 500 to 600° C., a deposition velocity of about 1.8 to 2.0 mm/hr, and presence of Cl. In Comparative Example, monosilane has a decomposition temperature of 300 to 400° C., a deposition velocity of about 1 mm/hr, and strong corrosion resistance.

The source gas including the trichlorosilane (TCS) is higher than the monosilane by about 200° C. at the decomposition temperature and the deposition temperature. As a result, during the chemical vapor deposition in the reactor 10, the source gas including the trichlorosilane (TCS) may lower a possibility to produce silicon powder as compared with the monosilane and thus deposition efficiency of silicon may be enhanced.

When the monosilane is exposed in the air without corroding the apparatus, a flame is generated and thus the sealing of the apparatus is required for safety. However, the trichlorosilane (TCS) may corrode the apparatus during a process due to the presence of CI, but even though the trichlorosilane (TCS) is exposed in the air, the flame is not generated and thus the trichlorosilane (TCS) has high safety.

In detail, the polysilicon manufacturing apparatus according to the exemplary embodiment includes the reactor 10 forming the reaction chamber 11, a plurality of pairs of electrical feedthroughs 20 installed on a base plate 21, and a plurality of pairs of rod filaments 30 installed in the electrical feedthroughs 20 to be connected to a rod bridge 31 at an upper end.

The reactor 10 is constituted by a bell type reactor to form reaction chamber 11 on the base plate 21 and coupled to the base plate 21 in a gas closed structure. The reactor 10 includes a bell jar 12 forming the reaction chamber 11 and a chamber cover 13 which is spaced apart from the bell jar 12 to run a coolant therebetween.

The base plate 21 is coupled with the reactor 10 to form the reaction chamber 11 and includes a gas inlet 22 and a gas outlet 23. Accordingly, the source gas is introduced into the reaction chamber 11 through the gas outlet 22 connected to a silicon-containing gas source (not illustrated) and the gas after reaction subjected to the chemical vapor deposition reaction is discharged to the outside of the reaction chamber 11 through the gas outlet 23.

The gas outlet 23 is provided at the center of the base plate 21 to discharge the gas after reaction. The gas inlets 22 are formed at multiple locations at the outside of the gas outlet 23, that is, the outside in a diameter direction of the base plate 21. Meanwhile, as an example, one gas inlet 22 may be included per 3 to 5 silicon rods 40. The source gas introduced from the end of the gas inlet 22 may have a gas velocity of 3 to 6 m/s.

The electrical feedthroughs 20 and 20 making a pair are extended and installed to the inside of the reaction chamber 11 at the outside of the base plate 21. An electrode 25 supported by a rod supporter 24 is connected to the ends of the electrical feedthroughs 20.

The rod filaments 30 and 30 making a pair are spaced apart from each other in the reaction chamber 11 to be horizontally connected to the erected upper end by the rod bridge 31. In addition, the rod filaments 30 and 30 making a pair are connected to an external electric energy supply source through the electrode 25 and the electrical feedthrough 20 at the lower end. Accordingly, a pair of rod filaments 30 and 30 forms one electric circuit together with the rod bridge 31.

When through the electrical feedthrough 20 and the electrode 25, current is run in the rod filament 30, whereas the source gas is supplied into the reaction chamber 11, while the rod filament 30 is heated, a chlorosilane-based compound included in the source gas is pyrolyzed in the reaction chamber 11.

The polysilicon is formed on the surfaces of the rod filament 30 glowing with red and the rod bridge 31 by chemical vapor deposition (CVD) after the chlorosilane-based compound is pyrolyzed. The polysilicon is precipitated on the surfaces of the rod filament 30 and the rod bridge 31 in a polycrystalline form and thus the silicon rod 40 and the rod bridge 31 may be increased by diameters having desired sizes.

As such, when the polysilicon is precipitated on the rod filament 30 and the rod bridge 31 to form the silicon rod 40, the cooling jacket 50 circulates the coolant to prevent the polysilicon from being deposited on the surface of the cooling jacket 50 and the silicon rod 40 is not melted.

That is, the coolant cools the high-temperature gas after reaction discharged to the gas passage 51 and the gas outlet 23 and thus the heat of the gas after reaction is transferred to the source gas in the reaction chamber 11 to prevent a turbulent flow from being formed. Accordingly, the source gas may efficiently form the laminar flow in the reaction chamber 11.

The cooling jacket 50 may be formed of incoloy (Incoloy 800H, Incoloy 800), stainless steel (SS316L, SS316) or hastelloy. The materials do not affect purity of the precipitated polysilicon, have high-temperature (for example, 1,000° C. or more) stability, have corrosion resistance, and have features in which processing is easy and a price is cheap.

The cooling jacket 50 is inserted to an installation hole 14 provided at the upper side of the reactor 10 to be supported by the base plate 21 at the lower end. The cooling jacket 50 forms the gas passage 51 at the inside to be connected to the gas outlet 23 formed in the base plate 21 and thus the gas after reaction may be discharged to the gas passage 51 and the gas outlet 23.

Further, the cooling jacket 50 forms the coolant passage 52 at the outside of the gas passage 51 to circulate the coolant. The coolant passage 52 is constituted to discharge the high-temperature coolant to the outside of the reactor 10 by introducing and circulating a low-temperature coolant from the outside of the reactor 10. For example, the temperatures of the coolant and the surface of the cooling jacket 50 may be 500° C.

The cooling jacket 50 is installed at the center of the reaction chamber 11, the gas outlet 23 is formed at the center on the base plate 21, and the gas inlet 22 is spaced apart from the gas outlet 23 in a diameter direction of the base plate 21 to be disposed at the outside. Accordingly, the gas passage 51 is connected to the gas outlet 23 to discharge the gas after reaction subjected to the reaction in the reaction chamber 11 to the outside of the reaction chamber 11.

Figure 2:
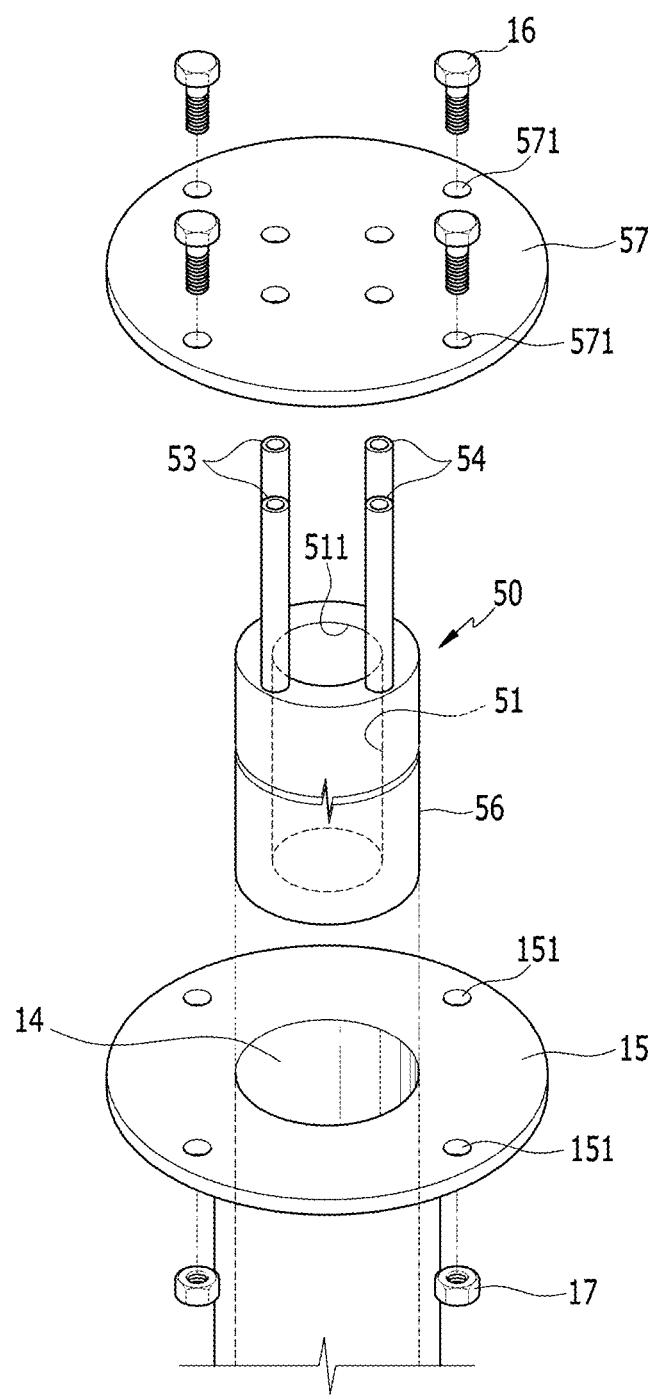
FIG. 2 is an exploded perspective view of an upper portion and a cooling jacket of the reactor in FIG. 1.
Figure 3:
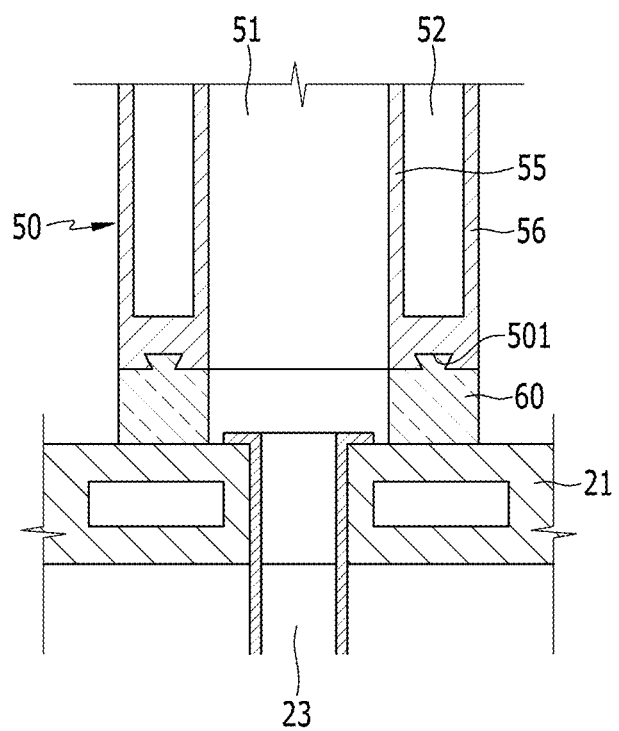
FIG. 3 is a partially cross-sectional view of a state in which the cooling jacket is installed on a base plate.

FIG. 2 is an exploded perspective view of an upper portion and a cooling jacket of the reactor in FIG. 1, and FIG. 3 is a partially cross-sectional view of a state in which the cooling jacket is installed on a base plate. Referring to FIGS. 1 to 3, the cooling jacket 50 includes a coolant inlet 53 and a coolant outlet 54 and includes an inner pipe 55 and an outer pipe 56 forming the gas passage 51 and the coolant passage 52.

The coolant inlet 53 is installed in the reactor 10 and connected to the coolant passage 52 to introduce a low-temperature coolant from the outside of the reactor 10. The coolant circulating the coolant passage 52 cools the surface of the cooling jacket 50 and thus the polysilicon is not deposited and the silicon rod 40 is not melted.

The coolant outlet 54 is connected to the coolant passage 52 to discharge a high-temperature coolant from the inside of the reactor 10. In the exemplary embodiment, two coolant inlets 53 and two coolant outlets 54 are provided, respectively, to introduce and discharge the coolant even in an emergency.

The inner pipe 55 and the outer pipe 56 are disposed in a double structure to form the gas passage 51 to the inside of the inner pipe 55 and form the coolant passage 52 at the outside of the gas passage 51 at an interval between the inner and outer pipes 55 and 56.

Further, the reactor 10 provides a first fringe 15 at the outside of the installation hole 14 penetrating at the upper side having a dome structure. The cooling jacket 50 provides a second fringe 57 fixed to the coolant inlet 53 and the coolant outlet 54.

For convenience, in FIG. 2, the coolant inlet 53 and the coolant outlet 54 are illustrated to be separated from the second fringe 57, but inserted and fixed to the second fringe 57 to be integrally formed.

The cooling jacket 50 is inserted into the reactor 10 through the installation hole 14 to maintain the parts of the coolant inlet 53 and the coolant outlet 54 to protrude outside the installation hole 14.

In this case, the second flange 57 is disposed on the first flange 15 to be fastened to the first flange 15 by a fastening member while closing the installation hole 14. For example, the fastening member is provided by a bolt 16 and a nut 17 to fasten the first flange 15 and the second flange 57 by fasteners 151 and 571 of the first and second flanges 15 and 57.

Figure 4:
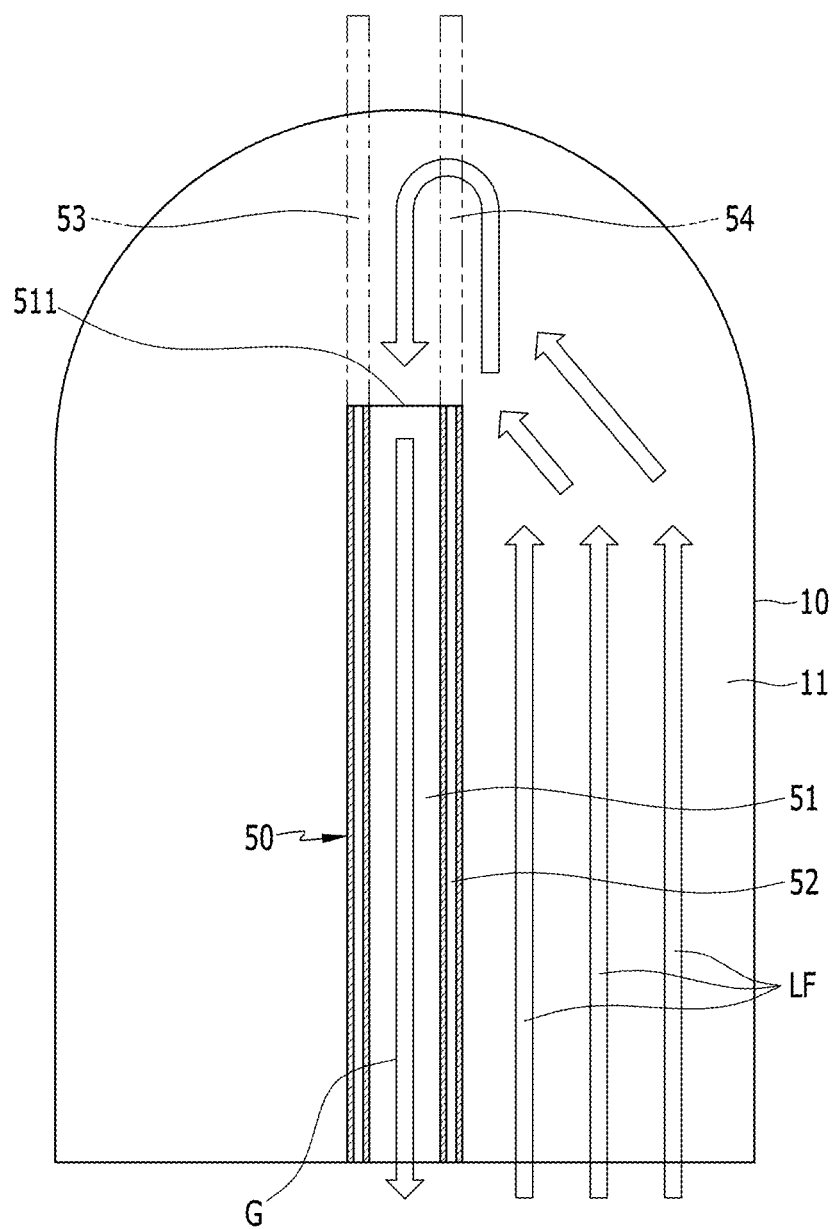
FIG. 4 is a state diagram illustrating that source gas forms a laminar flow in the reactor in FIG. 1.

FIG. 4 is a state diagram illustrating that source gas forms a laminar flow in the reactor in FIG. 1. Referring to FIGS. 1 to 4, the inner and outer pipes 55 and 56 form an opening 511 of the gas passage 51 corresponding to the upper end of the rod filament 30.

Accordingly, gas G after reaction in the reaction chamber 11 immediately is introduced to the gas passage 51 from the upper end of the silicon rod 40 to be discharged to the gas outlet 23. That is, the gas G after reaction does not have an effect on the source gas in the reaction chamber 11 in flow.

Referring back to FIGS. 1 to 3, the cooling jacket 50 is installed on the base plate 21 with a gasket 60 interposed therebetween. The gasket 60 communicates with the gas passage 51 and the gas outlet 23 and the communication is blocked from the inside of the reaction chamber 11.

Accordingly, the gas G after reaction through the gas passage 51 and the gas outlet 23 is supplied into the reaction chamber 11 to have no effect on the flow the source gas which is subjected to the chemical vapor deposition reaction. That is, a turbulent flow is not formed in the reaction chamber 11 by the gas G after reaction and a laminar flow (LF) may be efficiently formed.

The lower end of the cooling jacket 50 forms a concave groove 501 and the gasket 60 is coupled to the concave groove 501 at one side to be supported to the base plate 21 at the other side. The concave groove 501 is formed in a trapezoid structure in which the upper portion is narrow and the lower portion is wide to prevent separation of the gasket 60 when the cooling jacket 50 is inserted into the reactor 10. For example, the gasket 60 may be formed of a polytetrafluoroethylene resin having heat resistance.

Figure 5:
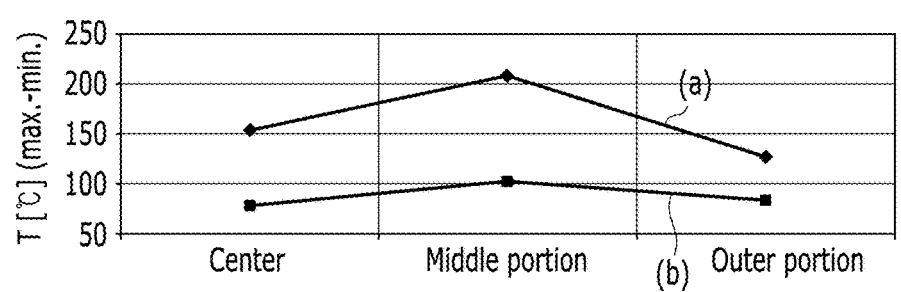
FIG. 5 is a graph illustrating a deviation in surface temperature between silicon rods for each position in the reactor in the related art and an exemplary embodiment.

FIG. 5 is a graph illustrating a deviation in surface temperature between silicon rods for each position in the reactor in the related art and an exemplary embodiment. Referring to FIG. 5, silicon rods in the related art have a surface temperature deviation a of about 70° C. among the center, the middle portion, and the outer portion in the reactor.

On the contrary, the silicon rods 40 of the exemplary embodiment have a surface temperature deviation b of about 20° C. among the center, the middle portion, and the outer portion in the reactor 10. As such, in the exemplary embodiment, the surface temperature deviation b of the silicon rods 40 may be lower than the surface temperature deviation a in the related art due to the installation of the cooling jacket 50.

That is, in the exemplary embodiment, the surface temperatures of the silicon rods 40 are uniform and the quality of the polysilicon may be improved. In the exemplary embodiment, due to the installation of the cooling jacket 50, upper and lower diameters of the silicon rod 40 are uniformized to reduce a calorific value and further decrease the surface temperature.

Figure 6:
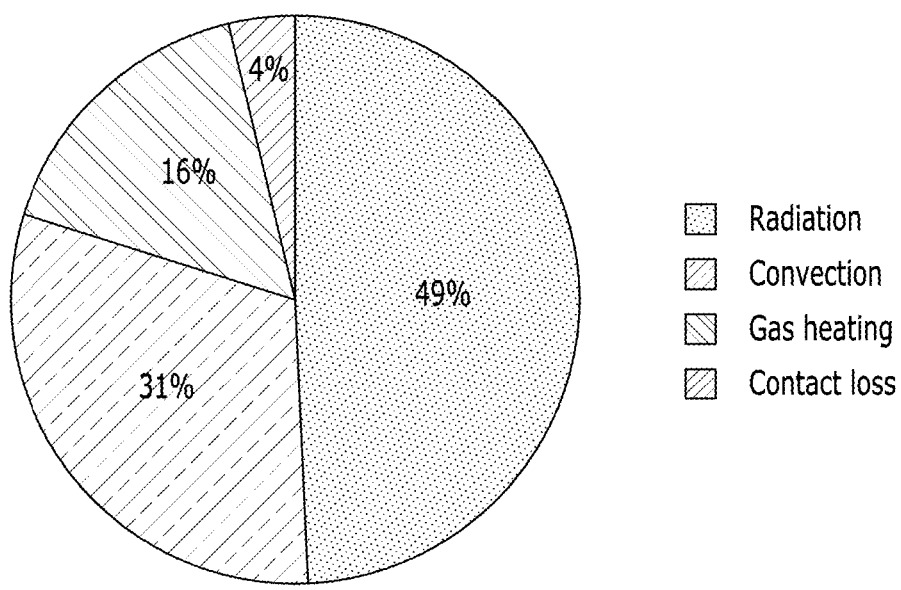
FIG. 6 is a graph illustrating power consumption in the related art.
Figure 7:
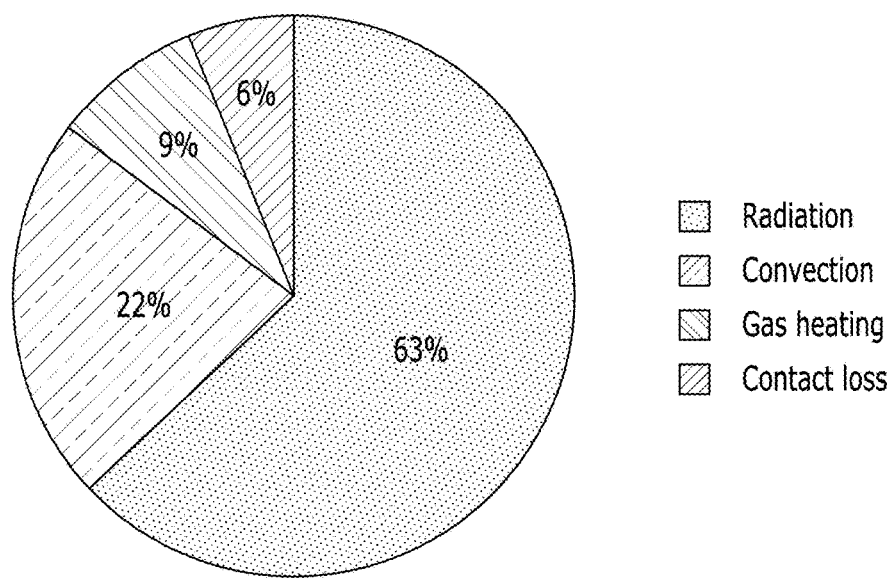
FIG. 7 is a graph illustrating power consumption in an exemplary embodiment.

FIG. 6 is a graph illustrating power consumption in the related art, and FIG. 7 is a graph illustrating power consumption in an exemplary embodiment. Referring to FIG. 6, the silicon rods in the related art consume power of 49% of radiation, 31% of convection, 16% of gas heating, and 4% of a contact loss.

Referring to FIG. 7, the silicon rods of the exemplary embodiment consume the power of 63% of radiation, 22% of convection, 9% of gas heating, and 6% of a contact loss. That is, in the exemplary embodiment, a heat loss by convection may be reduced and an electric basic unit may be lowered as compared with the related art.

Figure 8:
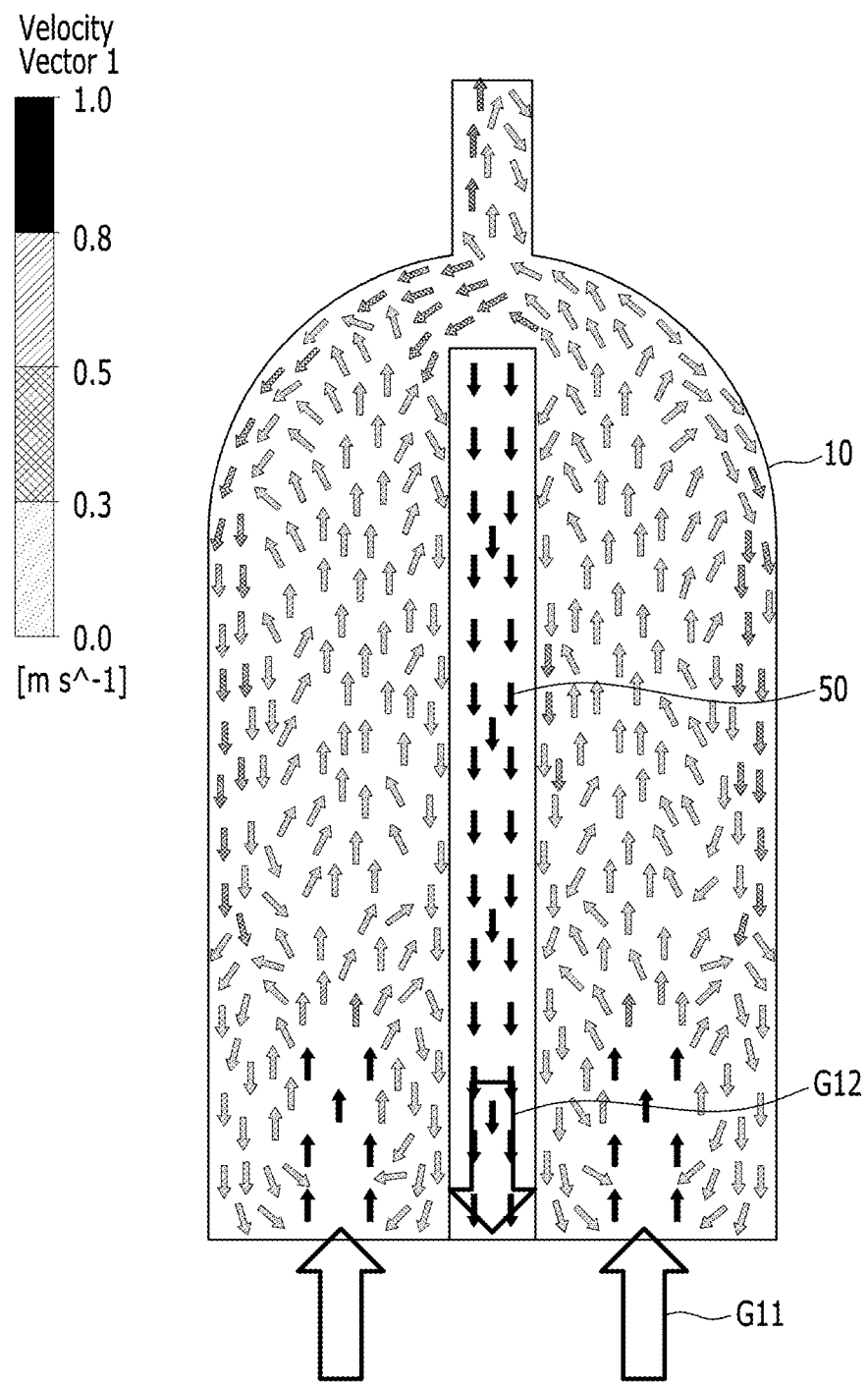
FIG. 8 is a state diagram illustrating that source gas forms a laminar flow by simulation in the reactor in FIG. 1.

FIG. 8 is a state diagram illustrating that source gas forms a laminar flow by simulation in the reactor in FIG. 1. Referring to FIG. 8, in the exemplary embodiment, source gas G11 is introduced from two lower sides of the reactor 10 and gas G12 after reaction is discharged from the center by using the cooling jacket 50 to entirely reduce a deviation in gas velocity by the source gas G11 in the reactor 10.

As a result, the source gas in the reactor 10 forms a laminar flow flowing in a predetermined direction. The deviation in gas velocity is small and the laminar flow is formed to reduce a diameter deviation of the silicon rod 40.

Figure 9:
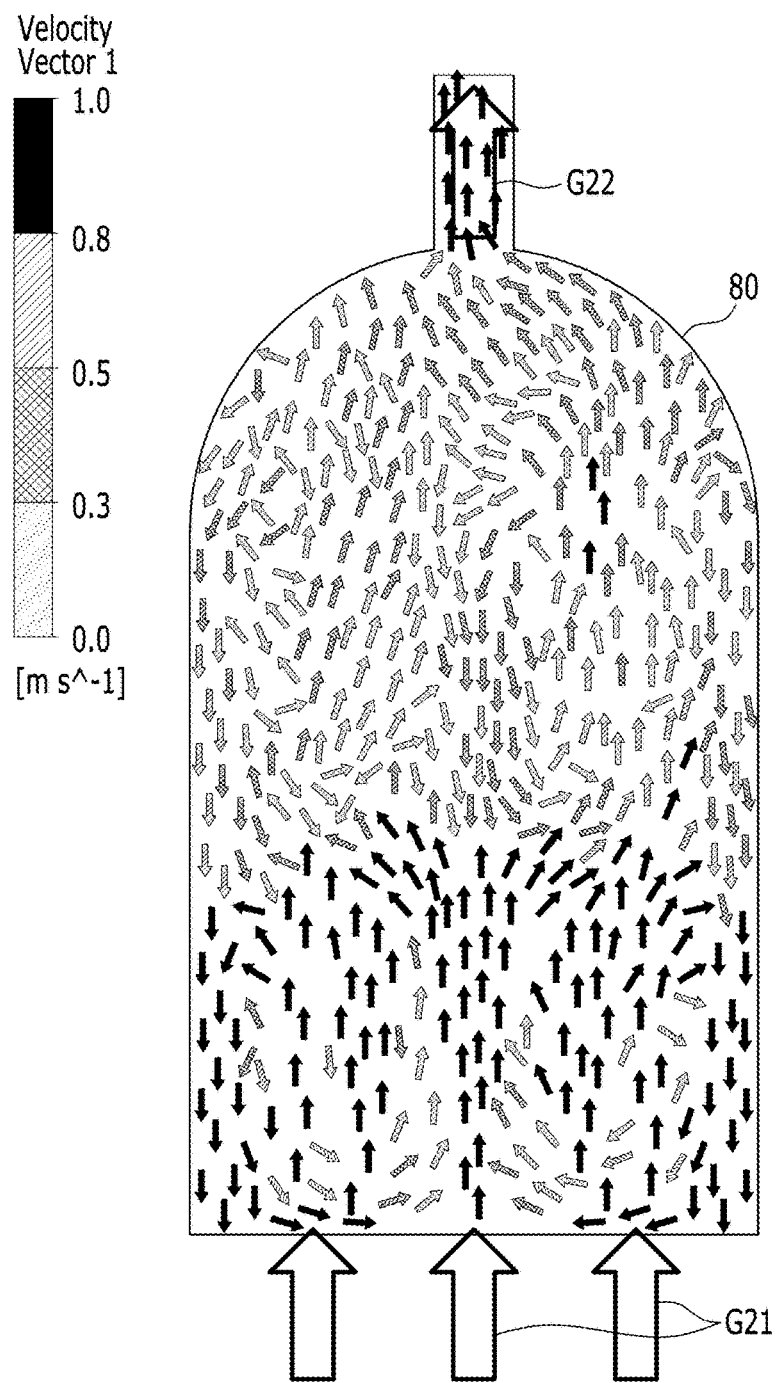
FIGS. 9, 10 and 11 are state diagrams illustrating that source gas forms a turbulent flow by simulation in reactors of Comparative Examples 1, 2, and 3.
Figure 10:
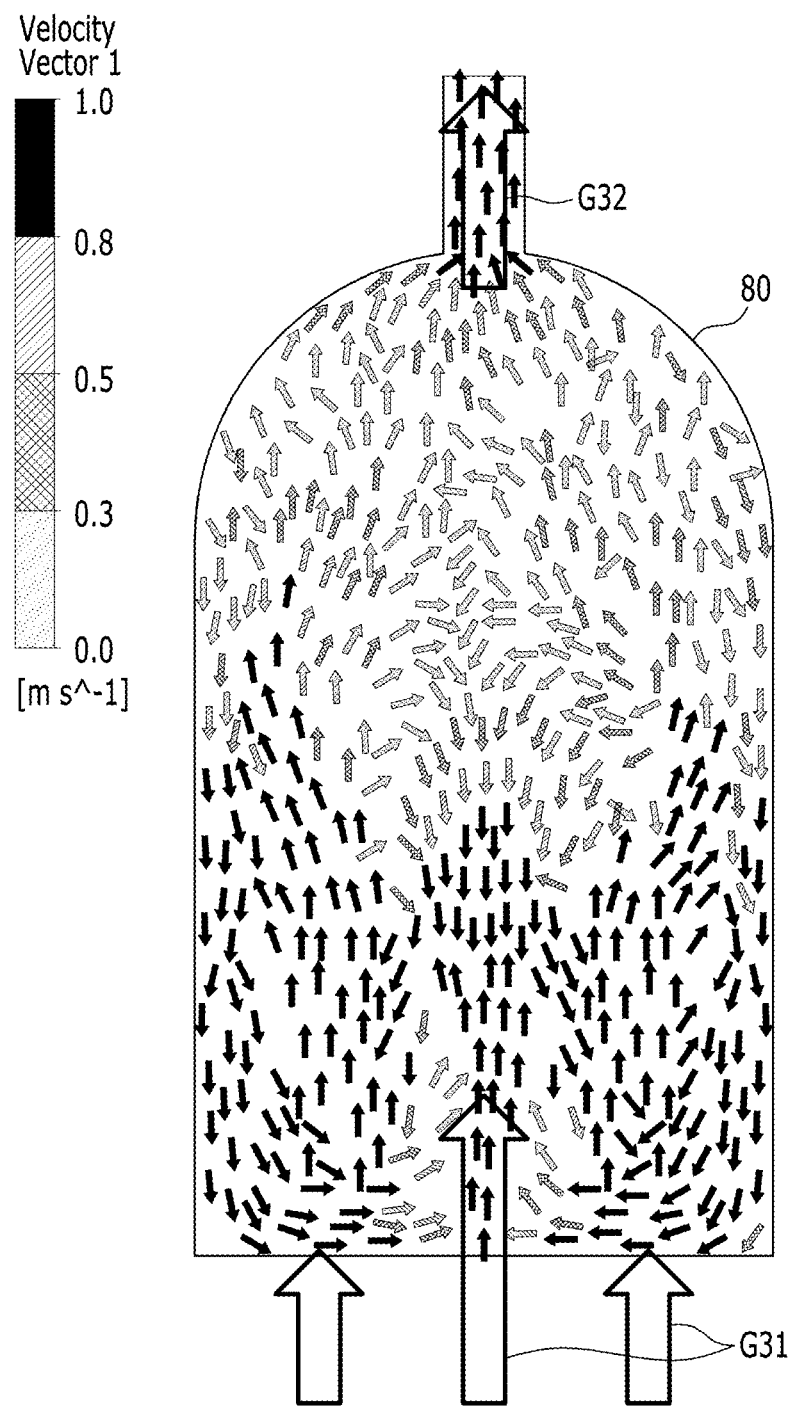
Figure 11:
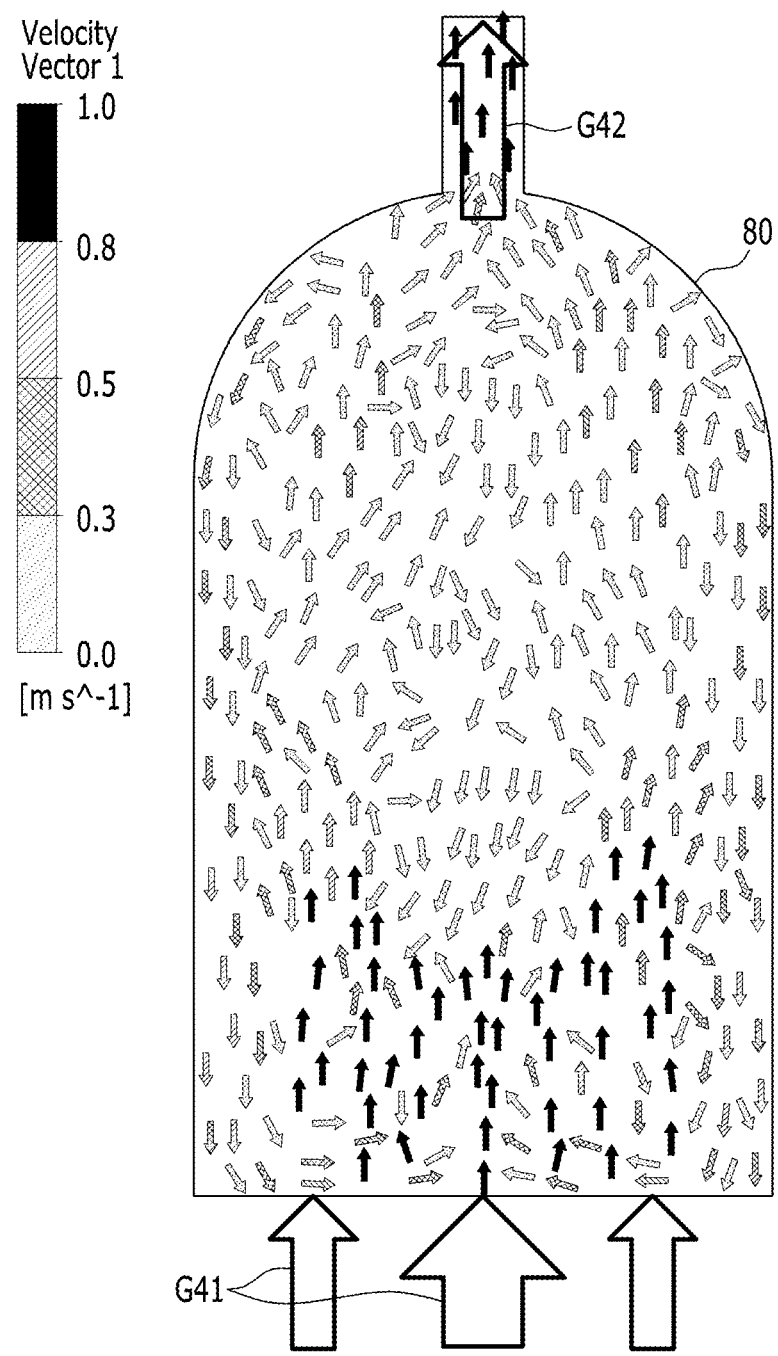

FIGS. 9, 10 and 11 are state diagrams illustrating that source gas forms a turbulent flow by simulation in reactors of Comparative Examples 1, 2, and 3. Referring to FIG. 9, in Comparative Example 1, source gas G21 is introduced from the lower center and two sides of the reactor 80 and gas G22 after reaction is discharged from the upper portion of the reactor 80.

Referring to FIG. 10, in Comparative Example 2, more source gas G31 is introduced from the center than the two lower sides of the reactor 80 (increase a diameter of the gas inlet) and gas G32 after reaction is discharged from the upper portion of the reactor 80.

Referring to FIG. 11, in Comparative Example 3, more source gas G41 is introduced from the center than the two lower sides of the reactor 80 (increase the number of gas inlets) and gas G42 after reaction is discharged from the upper portion of the reactor 80.

As such, in Comparative Examples 1, 2, and 3, a velocity deviation of gas by the source gases G21, G31, and G41 at the lower portion and the upper portion of the reactor 80 is large, and turbulent flows by the source gases G21, G31, and G41 are formed at the lower portion and the upper portion, respectively. The gas velocity deviation is large and the turbulent flow is formed and thus a diameter deviation of the silicon rod may be increased.

Figure 12:
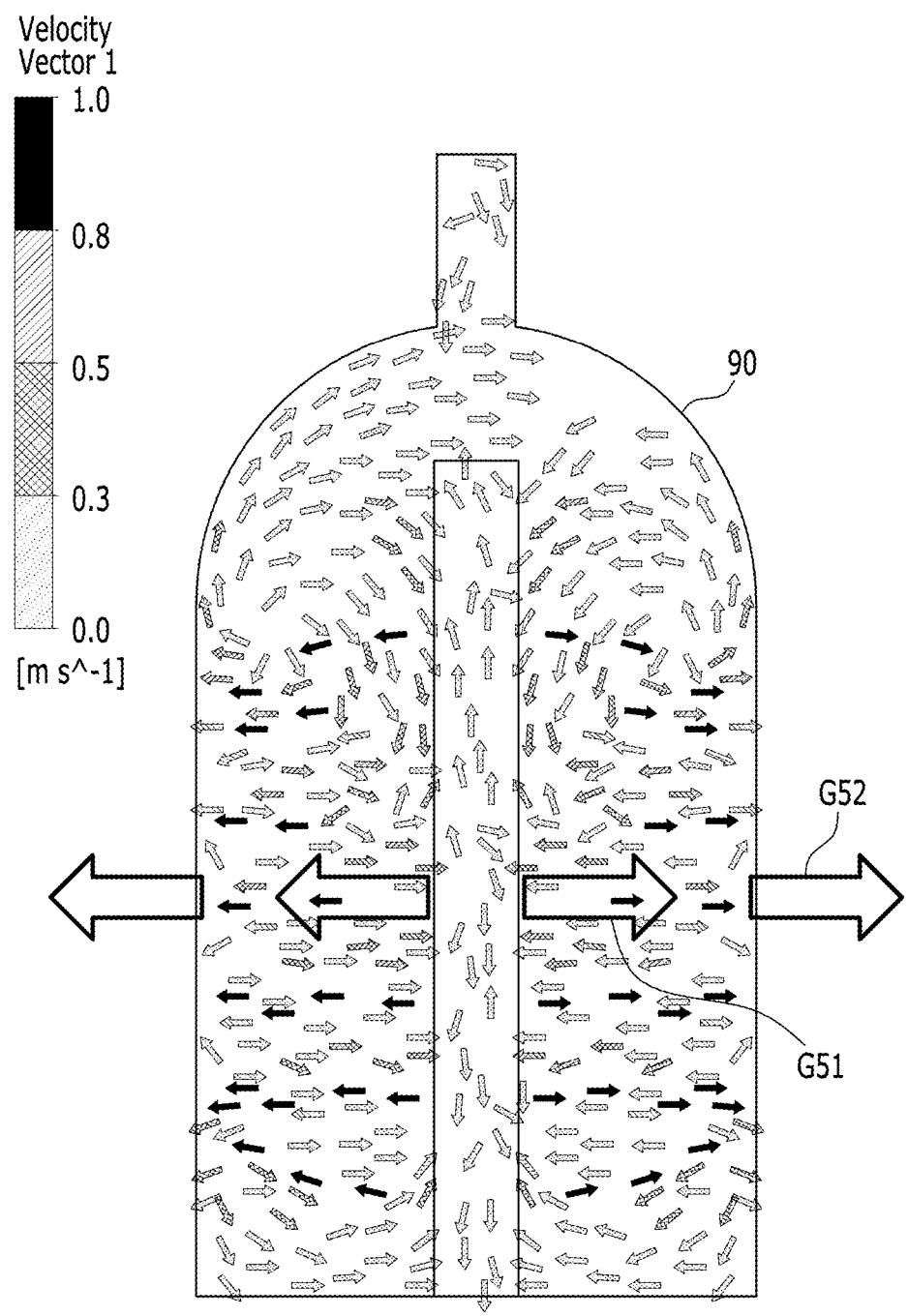
FIGS. 12, 13, 14 and 15 are state diagrams illustrating that source gas forms a turbulent flow by simulation in reactors of Comparative Examples 4, 5, 6 and 7.

FIGS. 12, 13, 14 and 15 are state diagrams illustrating that source gas forms a turbulent flow by simulation in reactors of Comparative Examples 4, 5, 6 and 7. Referring to FIG. 12, in Comparative Example 4, source gas G51 is introduced to a central side of a reactor 90 and gas G52 after reaction is discharged to an outer side of the reactor 90.

Figure 13:
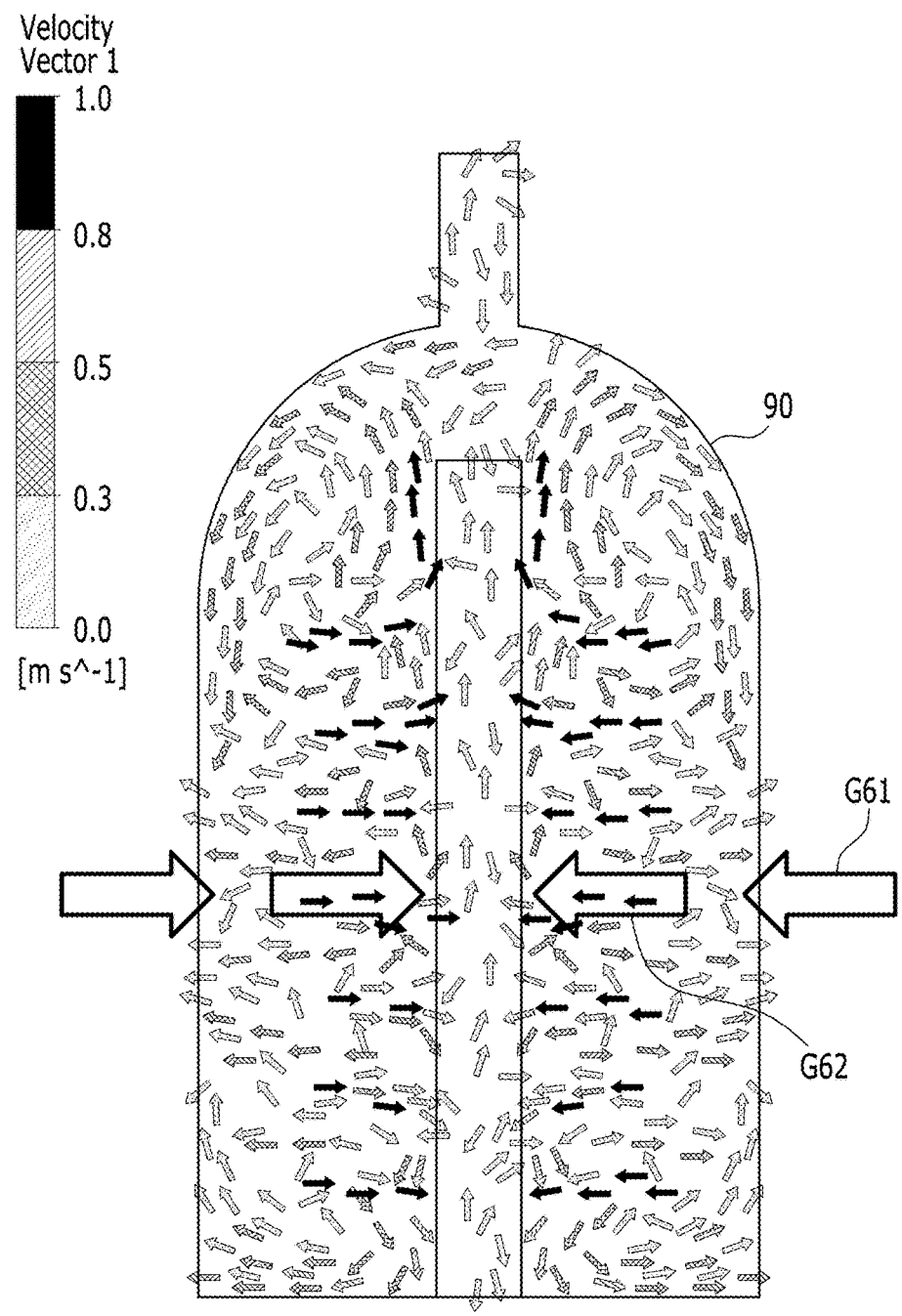
Figure 14:
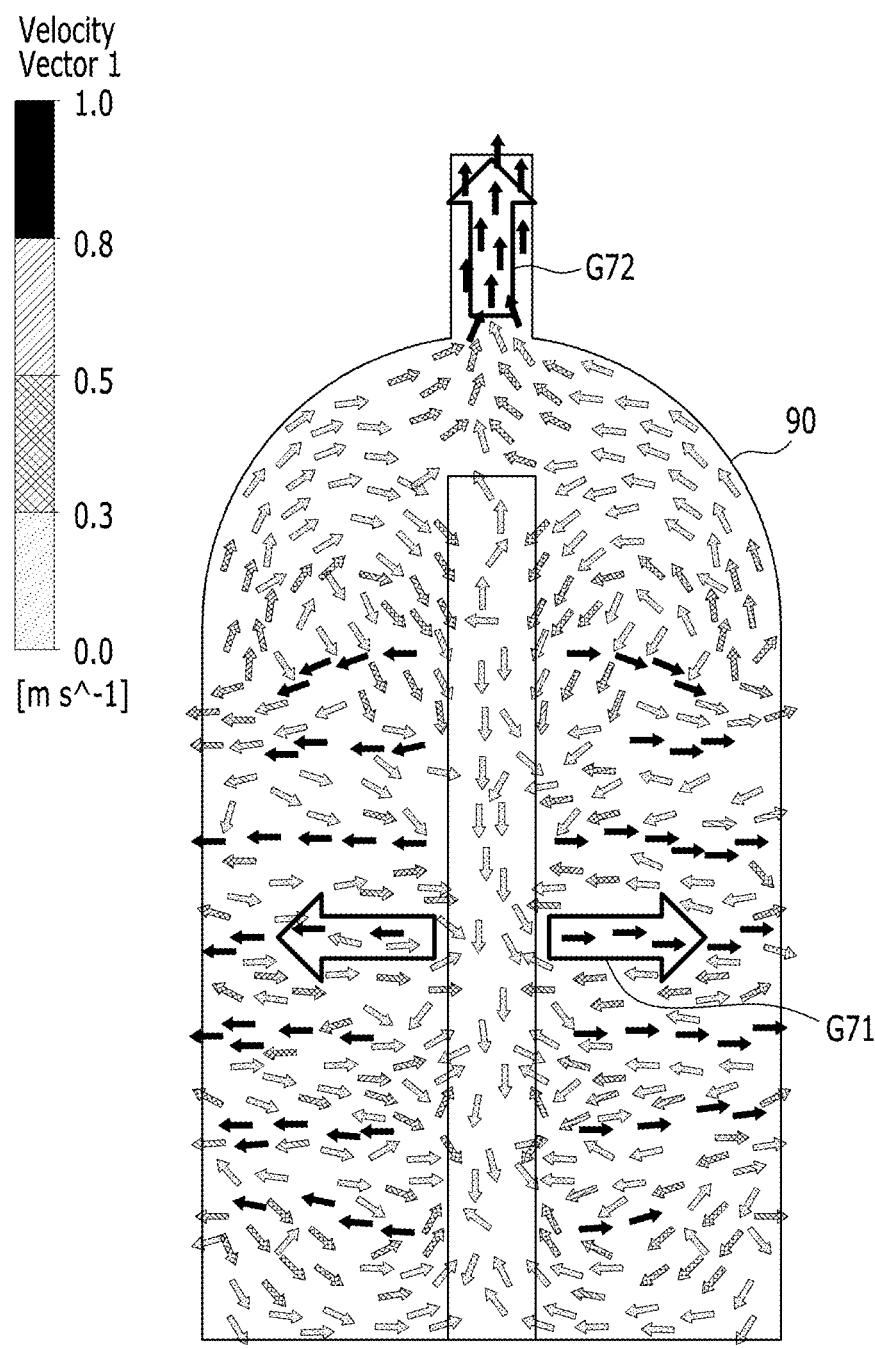

Referring to FIG. 13, in Comparative Example 5, source gas G61 is introduced to the outer side of the reactor 90 and gas G62 after reaction is discharged to the central side of the reactor 90. Referring to FIG. 14, in Comparative Example 6, source gas G71 is introduced to the central side of the reactor 90 and gas G72 after reaction is discharged to the upper portion of the reactor 90.

Figure 15:
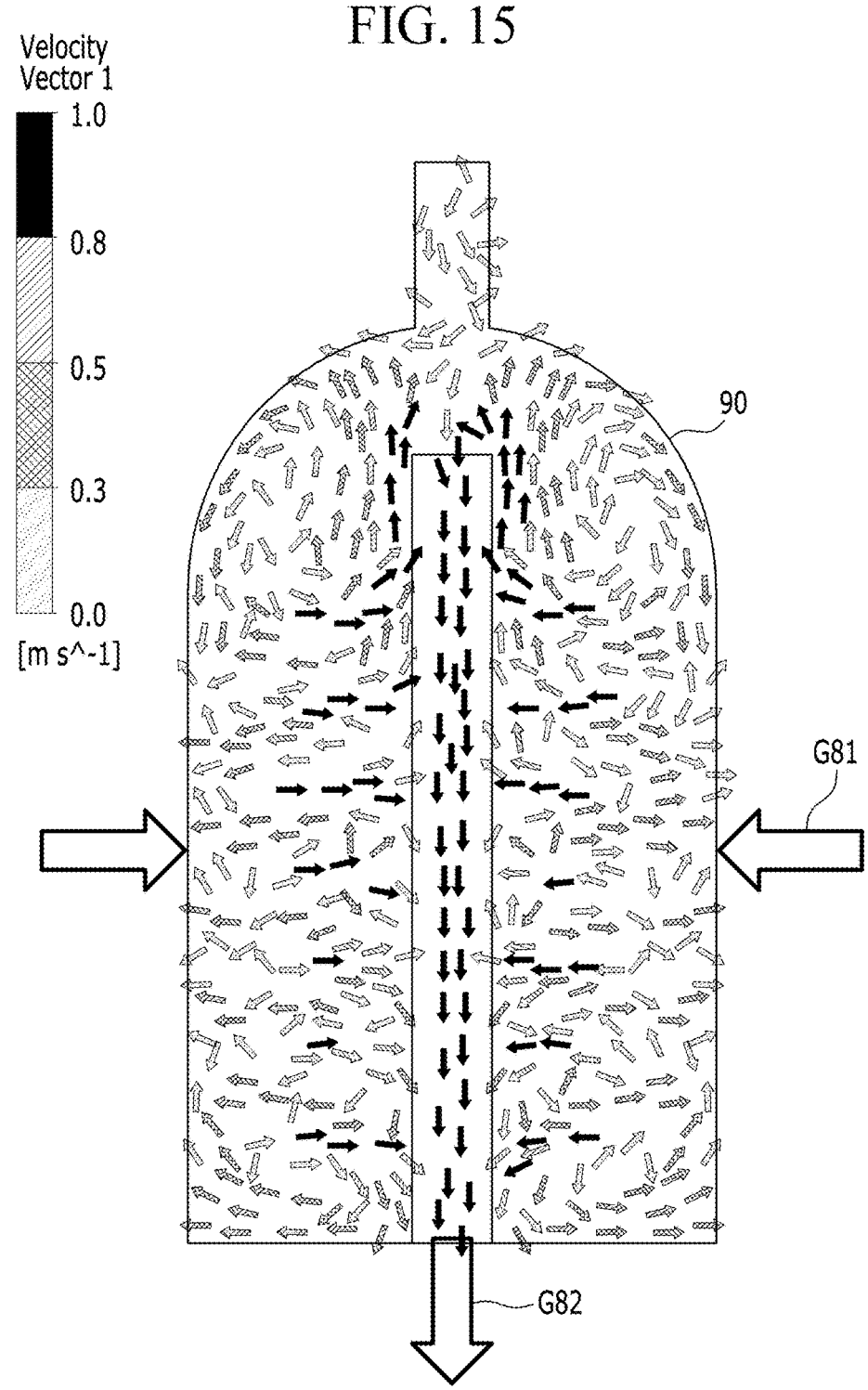

Referring to FIG. 15, in Comparative Example 7, source gas G81 is introduced to the outer side of the reactor 90 and gas G82 after reaction is discharged to the lower portion of the reactor 90 by using the cooling jacket 50.

As such, in Comparative Examples 4, 5, 6, and 7, a gas flow seems to be formed in one direction around the source gas introduction (the gas inlet), but the gas after reaction is not easily discharged and thus turbulent flows are formed everywhere. The turbulent flows may increase a diameter deviation of the silicon rod.

In the exemplary embodiment, in the silicon rod 40, the upper and lower diameters are uniformized and the surface temperature of the silicon rod 40 is uniformized to increase yield of the polysilicon. Further, in the exemplary embodiment, the quality of the polysilicon is improved due to reduction of hot spots and an electric basic unit may be decreased due to reduction in gas flow rate and reduction in power consumption (about 15 to 25%). The reduction of the electric basic unit may reduce purchase cost of the polysilicon.

Figure 16:
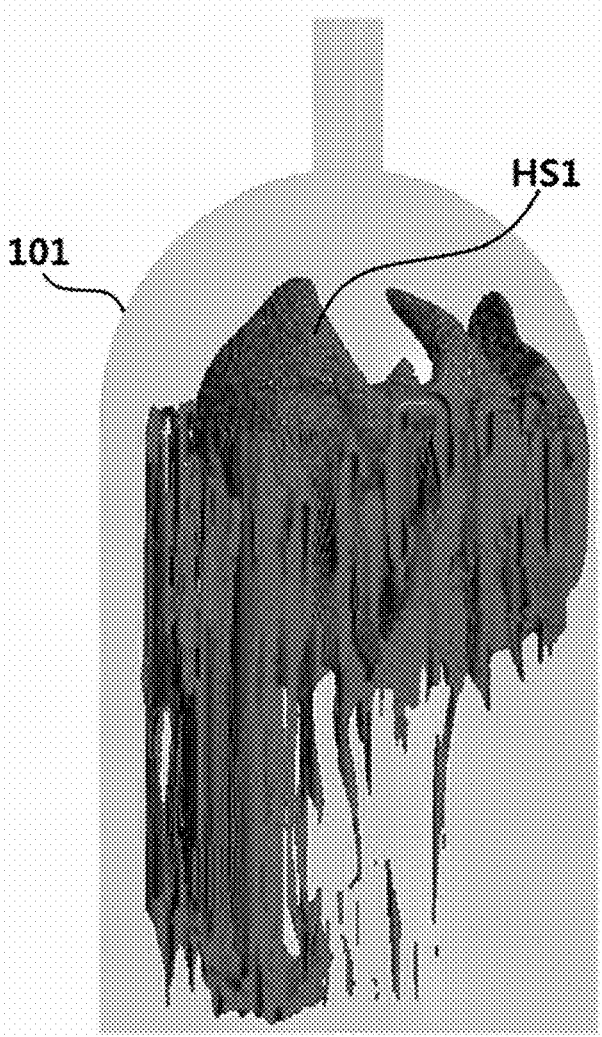
FIG. 16 is a state diagram illustrating that hot spots are formed in the reactor in Comparative Example.

FIG. 16 is a state diagram illustrating that hot spots are formed in the reactor in Comparative Example. Referring to FIG. 16, when one reactor of Comparative Examples 1 to 7 is applied to the polysilicon manufacturing apparatus, a hot spot HS1 is formed in the reactor 10.

Figure 17:
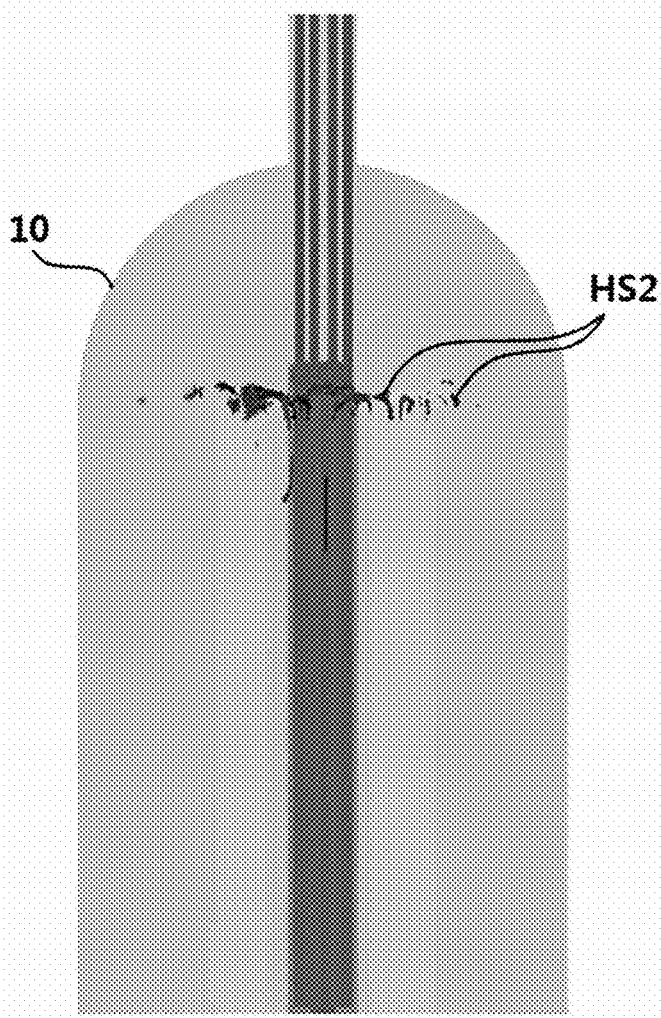
FIG. 17 is a state diagram illustrating that hot spots are formed in the reactor in FIG. 1.

FIG. 17 is a state diagram illustrating that hot spots are formed in the reactor in FIG. 1.

Referring to FIG. 17, when the reactor 10 according to the exemplary embodiment of the present invention is applied to the polysilicon manufacturing apparatus, a hot spot HS2 is formed in the reactor 10.

When comparing Comparative Example in FIG. 16 and Example in FIG. 17, in the case of a condition in which the source gas flow rate, the power supplied to the electrical feedthroughs, and the diameter of the gas inlet introducing the source gas are the same, as compared with the reactor 101 in Comparative Example, in the reactor 10 in Example, an area where the gas temperature is 1,050 K or more is significantly reduced. That is, as compared with the hot spot HS1 in the reactor 101 in Comparative Example, the hot spot HS2 in the reactor 10 in the exemplary embodiment of the present invention is significantly reduced.

While this invention has been described in connection with what is presently considered to be practical exemplary embodiments, it is to be understood that the invention is not limited to the disclosed embodiments, but, on the contrary, is intended to cover various modifications and equivalent arrangements included within the scope of the appended claims.

The invention claimed is:
1. A polysilicon manufacturing apparatus, comprising:
   a reactor disposed on a base plate to form a reaction chamber;
   a pair of electrical feedthroughs installed on the base plate to be extended to the inside of the reaction chamber;
   rod filaments installed on the electrical feedthroughs in the reaction chamber and connected to each other by a rod bridge at the upper end to form a silicon rod by chemical vapor deposition of source gas introduced to a gas inlet; and
   a cooling jacket inserted to an installation hole provided at the upper side of the reactor to be supported by the base plate,
   wherein the cooling jacket has a gas passage connected to a gas outlet formed on the base plate, the gas passage discharges the gas after reaction,
   wherein the cooling jacket has a coolant passage introducing and circulating a low-temperature coolant from the outside of the reactor, the coolant passage is formed at the outside of the gas passage to discharge a high-temperature coolant to the outside of the reactor,
   wherein the cooling jacket includes a coolant inlet installed in the reactor and connected to the coolant passage to introduce a low-temperature coolant, and a coolant outlet connected to the coolant passage to discharge a high-temperature coolant, and
   wherein the coolant inlet and the coolant outlet are extended from the coolant passage to outside of the reactor through the installation hole.

2. The polysilicon manufacturing apparatus of claim 1, wherein:
   the gas outlet is formed at the center of the base plate, and
   the gas inlet is disposed at a location spaced apart from the gas outlet to the outside in a diameter direction of the base plate.

3. The polysilicon manufacturing apparatus of claim 2, wherein:
   the cooling jacket is disposed at the center of the reaction chamber to connect the gas passage to the gas outlet.

4. The polysilicon manufacturing apparatus of claim 3, further comprising:
   a gasket disposed between the cooling jacket and the base plate,
   wherein the gasket communicates between the gas passage and the gas outlet and blocks the communication from the inside of the reaction chamber.

5. The polysilicon manufacturing apparatus of claim 4, wherein:
   a lower end of the cooling jacket forms a concave groove, and
   the gasket is coupled to the concave groove at one side and supported to the base plate at the other side.

6. The polysilicon manufacturing apparatus of claim 1, wherein:
   the cooling jacket further includes
   an inner pipe and an outer pipe, and
   wherein the inner pipe is disposed at inside of the outer pipe, the gas passage is formed at inside of the inner pipe, and the coolant passage is formed between outside of the inner pipe and inside of the outer pipe.

7. The polysilicon manufacturing apparatus of claim 6, wherein:
   the reactor provides a first flange at the outside of the penetrated installation hole,
   the cooling jacket includes a second flange fixed to the coolant inlet and the coolant outlet, and
   while the cooling jacket is inserted into the reactor, the second flange closes the installation hole on the first flange and is fastened to the first flange by a fastening member.

8. The polysilicon manufacturing apparatus of claim 7, wherein:
the inner pipe and the outer pipe form an opening of the gas passage corresponding to the upper end of the rod filaments.

9. The polysilicon manufacturing apparatus of claim 1, wherein:
the cooling jacket is formed by one of INCOLOY, stainless steel and HASTELLOY.

10. The polysilicon manufacturing apparatus of claim 1, wherein:
the gas inlet introduces the source gas including trichlorosilane (TCS) into the reaction chamber.

11. The polysilicon manufacturing apparatus of claim 1, wherein:
the gas inlet introduces the source gas including at least one of dichlorosilane (DCS), silicon tetrachloride (STC) and hydrogen into the reaction chamber.

* * * * *